US006462982B1

(12) United States Patent
Numata et al.

(10) Patent No.: US 6,462,982 B1
(45) Date of Patent: Oct. 8, 2002

(54) MAGNETIC RANDOM ACCESS MEMORY HAVING VOLTAGE CONTROL CIRCUITRY FOR MAINTAINING SENSE LINES AT CONSTANT LOW VOLTAGES

(75) Inventors: Hideaki Numata; Koichi Takeda, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/962,325

(22) Filed: Sep. 26, 2001

(30) Foreign Application Priority Data

Sep. 27, 2000 (JP) .................................... 2000-294525

(51) Int. Cl.[7] .............................................. G11C 11/00
(52) U.S. Cl. .................................. 365/158; 365/189.09
(58) Field of Search ........................... 365/158, 189.06, 365/189.09, 171

(56) References Cited

U.S. PATENT DOCUMENTS 6,259,644 B1 * 7/2001 Tran et al. ................. 365/209

6,278,631 B1 * 8/2001 Naji ........................... 365/158

\* cited by examiner

*Primary Examiner*—Vu A. Le
(74) *Attorney, Agent, or Firm*—Young & Thompson

(57) ABSTRACT

A matrix array of memory cells are located on intersections of word lines and sense lines. Each memory cell has a magnetoresistance element and a switching element which establishes a connection between a corresponding sense line and the magnetoresistance element when a corresponding word line is addressed. A number of sense circuits are respectively provided for the sense lines. Each sense circuit includes a capacitive element connected to the corresponding sense line and a switching element for applying a voltage to the capacitive element and causing it to discharge when the corresponding sense line is addressed. The voltage developed across the capacitive element of each sense circuit is used to produce a binary output signal representative of information stored in an address memory cell. A number of voltage control elements are provided for maintaining the sense lines at constant lower voltages regardless of higher voltages produced by the sense circuits.

20 Claims, 5 Drawing Sheets

MAGNETIC RANDOM ACCESS MEMORY HAVING VOLTAGE CONTROL CIRCUITRY FOR MAINTAINING SENSE LINES AT CONSTANT LOW VOLTAGES

RELATED APPLICATION

This application is related to co-pending U.S. patent application No. 09/884,669, filed Jun. 19, 2001, of Hideaki Numata et al., and assigned to the same assignee as the present application.

BACKGROUND OF THE INVENTION

1. Field of the Invention

The present invention relates generally to nonvolatile random access memories and more specifically to a magnetic random access memory using a magnetoresistance element.

2. Description of the Related Art

U.S. Pat. No. 5,748,519 discloses a magnetic RAM in which magnetic memory cells are each comprised of a giant magnetoresistance element and organized into first and second array portions, In each row of the first array portion, the GMRs are connected in series between a row transistor and a first common output line. Likewise, in each row of the second array portions, the GMRs are connected in series between a row transistor and a second common output line. During a read mode, a current is produced in the GMRs of a selected row of the first cell array portion as well as in the GMRs of the corresponding row of the second cell array portion. One of the cell array portions is used to produce a reference voltage. The voltage developed on each common output line is proportional to the total value of the resistances of the series-connected memory cells. A differential amplifier is connected to the first and second common lines to produce an output voltage representing the difference between the voltages developed on the first and second output lines. However, parasitic elements arise from the physical separation of the cell array into the two array portions. Therefore, if variability exists in the operating characteristics of the magnetoresistance elements of the memory it is difficult to implement a magnetic RAM having a sufficient amount of operating margin, In addition, since the total resistance of a selected row contributes to a significant portion of the voltage developed at the common output line, the amount of the voltage contributed by a memory cell of the selected row is small. As a result, the prior art magnetic RAM is less tolerant of cell variability and noise. The problem could be overcome only at the cost of an increase in the resistance of each GMR element, which would require an increase both in power consumption and memory chip size. Furthermore, the total value of the resistances of each selected row inherently includes the turn-on resistance of each row transistor. Since the GMR is a type of device whose resistance is of the same order of magnitude as the resistance of the associated line, the voltage drop contributed by the row transistor and the associated line resistance to the output voltage cannot be ignored, requiring precision sense amplifiers.

U.S. Pat. No. 5,640,343 discloses a magnetic memory array. Each memory cell consists of a magnetic tunnel junction (TMR) element and a diode electrically connected in series. However, a paper titled "Bias Voltage Dependence of Tunneling Magnetoresistance and Annealing Effect in Spin Dependent Tunnel Junctions", J. J. Sun et al, Journal of Magnetics Society of Japan, Vol. 23, No. 1–2, pages 55–57, describes that as the voltage across the tunnel junction increases the magnetoresistance (NR) ratio decreases due to the known bias effect, and hence precision sense amplifiers would be required to detect voltage variations. Further, the tunneling magnetoresistance element cannot tolerate high voltages as described in a paper under the title of "Observation and analysis of breakdown of magnetic tunnel junctions", W. Oepts, et al, Journal of Magnetism and Magnetic Materials Vol. 198–199, pages 164–166. The application of a high voltage across a tunneling magnetoresistance element would break down the tunnel barrier and shorten its lifetime.

SUMMARY OF THE INVENTION

It is therefore an object of the present invention to provide a magnetic random access memory tolerant of variability of the operating characteristics of magnetoresistance elements and capable of operating with a sufficient margin of allowance.

A second object of the present invention is to provide a magnetic random access memory capable of precision readout operation by compensating for the voltage drop caused by the line resistance and transistor's turn-on resistance connected in series.

A third object of the present invention is to provide a magnetic random access memory capable of high speed readout operation by simultaneously reading stored information from a plurality of memory cells connected to the same word line.

A fourth object of the present invention is to provide a magnetic random access memory using tunneling magnetoresistance elements in the memory cells capable of preventing the breakdown of their tunnel barrier and their bias effect of the tunneling magnetoresistance elements.

A fifth object of the present invention is to provide a low power consumption magnetic random access memory by utilizing energy stored on capacitors.

According to a first aspect, the present invention provides a magnetic random access memory comprising a plurality of word lines, a plurality of sense lines, a matrix array of memory cells, each memory cell being located on an intersection of a corresponding one of the word lines and a corresponding one of the sense lines, each memory cell including a magnetoresistance element and a switching element which establishes a connection between the corresponding sense line and the magnetoresistance element when the corresponding word line is addressed. A plurality of sense circuits respectively correspond to the sense lines. Each sense circuit includes a capacitive element connected to the corresponding sense line and a switching element for applying a voltage to the capacitive element and discharging energy stored in the capacitive element when the corresponding sense line is addressed. A plurality of voltage control elements are respectively connected in the sense lines for maintaining the sense lines at constant lower voltages regardless of higher voltages respectively produced by the sense circuits.

According to a second aspect, the present invention provides a magnetic random access memory comprising a plurality of word lines, a plurality of pairs of sense lines, and a matrix array of memory cells, each memory cell being located on an intersection of a corresponding one of the word lines and a corresponding one of the pairs of the sense lines, each memory cell including a first magnetoresistance element and a first switching element which establishes a first connection between a first one of the corresponding pair of sense lines and the first magnetoresistance element when the corresponding word line is addressed. Each memory cell further includes a second magnetoresistance element and a second switching element which establishes a second connection between a second one of the corresponding pair of sense lines and the second magnetoresistance element when the corresponding word lines is addressed. A plurality of sense circuits respectively correspond to the pairs of sense lines, each sense circuit including a first capacitive element connected to a first one of the corresponding pair of sense lines and a first switching element for applying a voltage to the first capacitive element and discharging energy stored therein when the first one of the corresponding pair of sense lines is addressed. Each sense circuit further includes a second capacitive element connected to a second one of the corresponding pairs of sense lines and a second switching element for applying a voltage to the second capacitive element and discharging energy stored therein when the second one of the corresponding pair of sense lines is addressed simultaneously with the first one of the corresponding pair of sense lines. A plurality of pairs of voltage control elements are respectively connected in the pairs of sense lines for maintaining all the sense lines at constant lower voltages regardless of higher voltages respectively produced by the sense circuits. A plurality of differential amplifiers may be provided respectively corresponding to the sense circuits, each of the differential amplifiers producing a difference output representative of the difference between voltages developed by the first and second capacitive elements.

According to a third aspect, the present invention provides a magnetic random access memory comprising a first plurality of word lines, a second plurality of word lines, a first plurality of sense lines, a second plurality of sense lines, a first plurality of reference cells respectively corresponding to the first plurality of sense lines, each reference cell including a resistance element and a switching element for establishing a resistive connection between the resistance element and the corresponding sense line when one of the second plurality of word lines is addressed, and a second plurality of reference cells respectively corresponding to the second plurality of sense lines, each reference cell including a resistance element and a switching element for establishing a resistive connection between the resistance element and the corresponding sense line when one of the first plurality of word lines is addressed. In a first matrix array of memory cells, each memory cell is located on an intersection of a corresponding one of the first plurality of word lines and a corresponding one of the first plurality of sense lines, each memory cell including a magnetoresistance element and a switching element for establishing a connection between the corresponding sense line and the magnetoresistance element when the corresponding word line is addressed. In a second matrix array of memory cells, each memory cell is located on an intersection of a corresponding one of the second plurality of word lines and a corresponding one of the second plurality of sense lines, each memory cell including a magnetoresistance element and a switching element for establishing a connection between the corresponding sense line and the magnetoresistance element when the corresponding word line is addressed, A first plurality of sense circuits respectively correspond to the first plurality of sense lines, each sense circuit including a capacitive element connected to the corresponding sense line and a switching element for applying a voltage to the capacitive element and discharging energy stored in the capacitive element when the corresponding sense line is addressed, and a second plurality of sense circuits respectively corresponding to the second plurality of sense lines, each sense circuit including a capacitive element connected to the corresponding sense line and a switching element for applying a voltage to the capacitive element and removing the voltage when the corresponding sense line is addressed for discharging energy from the capacitive element when the corresponding sense line is addressed. A first plurality of voltage control elements are respectively connected in the first plurality of sense lines for maintaining the first plurality of sense lines at constant lower voltages regardless of higher voltages respectively produced by the first plurality of sense circuits. A second plurality of voltage control elements are respectively connected in the second plurality of sense lines for maintaining the second plurality of sense lines at constant lower voltages regardless of higher voltages respectively produced by the second plurality of sense circuits. A plurality of differential amplifiers may be provided so that each of the differential amplifiers produces an output voltage representative of the difference between a voltage developed across the capacitive element of a corresponding one of the first plurality of sense circuits and a voltage developed across the capacitive element of a corresponding one of the second plurality of sense circuits.

According to a fourth aspect, the present invention provides a magnetic random access memory comprising a plurality of word lines, a plurality of sense lines, a matrix array of memory cells, each memory cell being located on an intersection of a corresponding one of the word lines and a corresponding one of the sense lines, each memory cell including a magnetoresistance element and a switching element which establishes a connection between the corresponding sense line and the magnetoresistance element when the corresponding word line is addressed. A plurality of sense circuits respectively correspond to the sense lines. Each sense circuit includes a first capacitive element, a first switching element for applying a voltage to the first capacitive element through a first circuit node, a second capacitive element, a second switching element for applying a voltage to the second capacitive element through a second circuit node, and a third switching element for exclusively connecting one of the first circuit node and the second circuit node to the corresponding sense line. A column decoder selectively addresses the sense lines, the column decoder being responsive to control signals from a timing controller for controlling the first, second and third switching elements of one of the sense circuits corresponding to the addressed sense line for discharging energy stored in the first capacitive element of the one sense circuit and discharging energy stored in the second capacitive element of the one sense circuit. A row decoder selectively addresses the word lines. A write circuit initially sets one of the memory cells addressed by the column and row decoders in one of high and low resistance states depending on information to be stored therein. The write circuit is responsive to a control signal from the timing controller for setting the one memory cell in a reference resistance state after energy is discharged from the first capacitive element. A plurality of voltage control elements are respectively connected in the sense lines for maintaining the sense lines at constant lower voltages regardless of higher voltages respectively produced by the sense circuits. A plurality of differential amplifiers may be provided corresponding to the sense circuits. Each differential amplifier may be connected to the first and second circuit nodes of the corresponding sense circuit for producing a voltage representative of the difference between voltages developed at the first and second circuit nodes.

BRIEF DESCRIPTION OF THE DRAWINGS

The present invention will be described in detail further with reference to the following drawings, in which.

DETAILED DESCRIPTION

Figure 1:
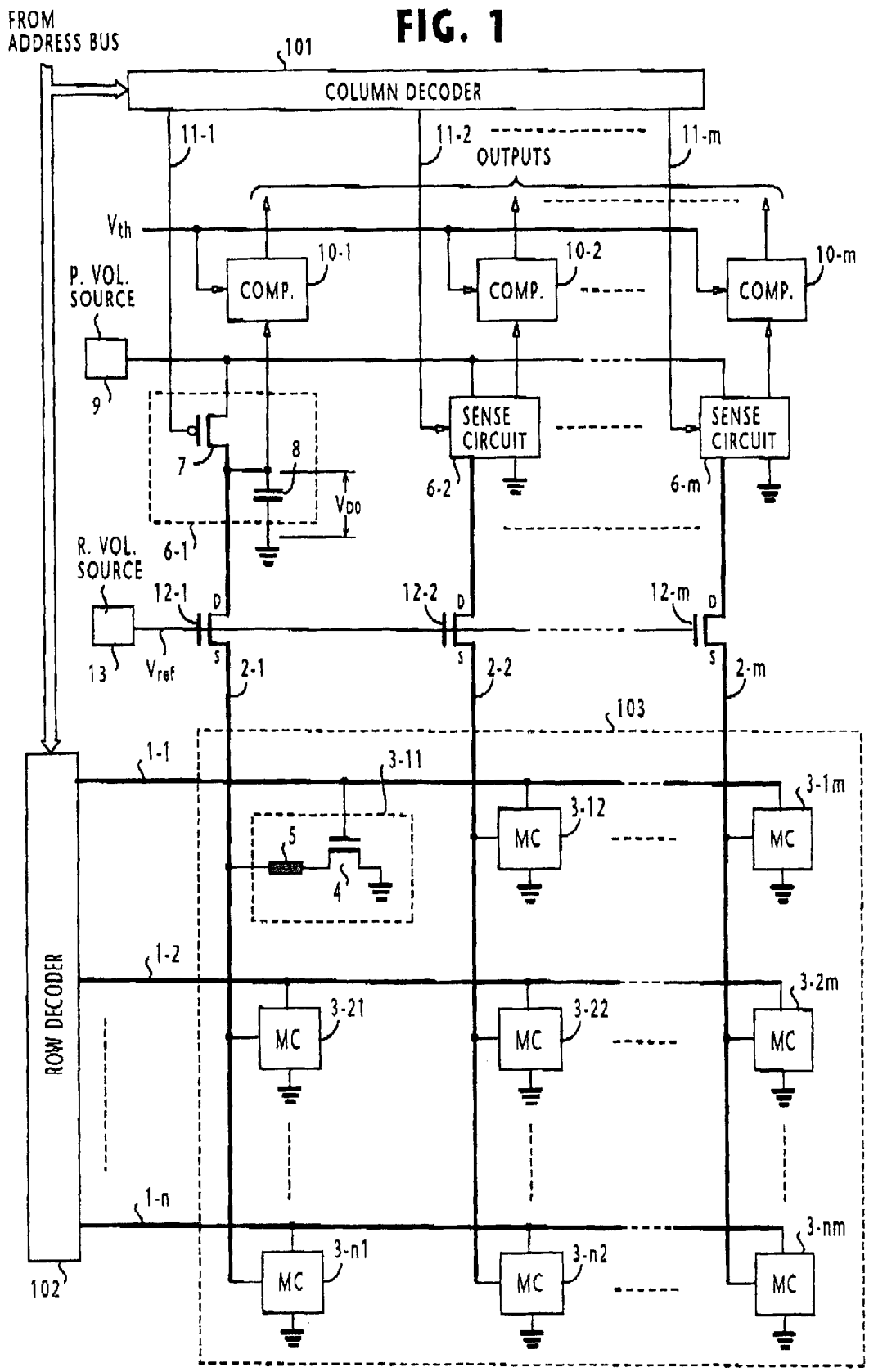
FIG. 1 is a block diagram of a magnetic random access memory according to a first embodiment of the present invention.

Referring now to FIG. 1, there is shown a magnetic random access memory (MRAM) according to a first embodiment of the present invention. The magnetic RAM is comprised of a column decoder 101, a row decoder 102, and a memory cell array 103.

Memory cell array 103 includes a plurality of memory cells 3 arrayed on intersections of word lines 1—1 through 1-n and sense lines 2-1 through 2-m. Each memory cell is made up of a MOS switching transistor 4 and a magnetoresistance element 5 of either tunnel junction type (TMR) or a giant magnetoresistance type (GMR). The switching transistor 4 has its gate connected to the associated word line and has its drain connected through the magnetoresistance element 5 to the associated sense line 2. The source of the switching transistor 4 is connected to ground. Alternatively, the connection of the transistor 4 and magnetoresistance element 5 in each memory cell 3 may be reversed so that the magnetoresistance element 5 is connected at one end to ground.

Although not shown in the drawings, there is also provided a write circuit which includes an array of coils arranged in locations respectively corresponding to the memory cells 3 for magnetizing their magnetoresistance elements.

Sense lines 2-1~2-m are driven by a plurality of sense circuits 6-1~6-m, respectively. Each of the sense circuits 6 includes a MOS switching transistor 7 and a capacitor 8. Switching transistor 7 has its source-drain path connected between a power voltage source 9 and the associated sense line 2 and the gate coupled to a corresponding column line 11 of the column decoder 101 so that when the corresponding column line is at low level the transistor 7 of each sense circuit 6 is in an ON state and charges the capacitor 8 to an initial voltage $V_{D0}$ supplied from the voltage source 9. Thus, all sense lines are normally maintained at voltage $V_{D0}$. A plurality of comparators 10-1~10-m are provided. Each comparator 10 is connected to the circuit node between the transistor 7 and the capacitor 8 to detect a voltage change that occurs at the circuit node when a memory cell of the corresponding sense line is addressed and produces an output voltage at one of two discrete values depending on whether the voltage change is higher or lower than a threshold voltage $V_{th}$.

In order to maintain all sense lines 2 at a low, constant voltage, a plurality of MOS transistors 12-1~12-m are provided. Each transistor 12 has a drain-source path connected between the associated sense circuit 6 and the associated column of memory cells 3. The gate of each transistor 12 is maintained at a reference voltage $V_{ref}$ supplied from a common voltage source 13. In the illustrated example, the drain of each transistor 12-1 is connected to the capacitor 8 of the sense circuit 6–1 and the source of the transistor is connected to the memory cell transistors 3–11~3-n1. The drain and source of each transistor 12 respectively function as input and output terminals of the transistor.

If the drain (input) voltage $V_D$ of each transistor 12 is higher than the its source (output) voltage $V_S$ of the transistor, the output voltage (i.e., the sense-line voltage) $V_S$ is equal to the reference voltage $V_{ref}$ minus a constant voltage drop $V_{drp}$ determined by te threshold of the transistor 12 as follows:

$$V_S = V_{ref} - V_{drp} \qquad (1)$$

Therefore, each transistor 12 introduces a constant voltage drop regardless of the input terminal voltage of the transistor if it is higher than the output terminal voltage of the transistor. The sense-line voltage is thus maintained at a constant low voltage $V_S$ regardless of a higher drain (input) voltage $V_D$.

Word lines 1–1~1-n are addressed by the row decoder 102 in response to a row address supplied from an address bus, not shown. When the row decoder 102 addresses a word line, for example, word line 1—1, it applies a voltage to the gates of all transistors 4 that are connected to that word line. All switching transistors 4 of the addressed word line are turned ON, causing currents to flow through all magnetoresistance elements of the addressed word line.

Due to the provision of the transistors 12, the voltages $V_S$ applied to all magnetoresistance elements 5 of the addressed word line remain constant, causing same currents to flow through these magnetoresistance elements, even though the capacitors 8 may develop different voltages $V_D$.

In response to a column address from the address bus, the column decoder 101 selects one of the sense circuits 6, for example circuit 6–2, to address the memory cell 3–12. This is achieved by the application of a voltage from the column decoder 101 to the gate of transistor 7 of the sense circuit 6-2. As a result, in the selected sense circuit 6–2, the transistor 7 turns OFF and the capacitor 8 begins to discharge its stored energy. Since Equation (1) holds as long as the output voltage $V_D$ of the selected sense line 11–2 is higher than the input voltage $V_S$, the current continues to flow at a constant value through the magnetoresistance element 4 of the addressed memory cell 3–12.

The voltage $V_D(t)$ developed by the capacitor 8 when it is discharged varies with time as follows:

$$V_D(t) = V_{D0} - \frac{1}{C}\int I_S dt = V_{D0} - \frac{V_S}{CR}t \qquad (2)$$

where, C is the value of capacitor 8, $I_S$ is the current flowing through the magnetoresistance element 5, and R is the load resistance of transistor 4.

Therefore, when the magnetoresistance element 5 is in a high resistance state, the capacitor 8 develops a decreasing voltage of small magnitude, otherwise a decreasing voltage of large magnitude. Since the resistance of the magnetoresistance element 5 is determined by the logical value of the information to be stored in the memory cell 3, an output of binary "1" or "0" is produced by the corresponding comparator 10.

Since the voltage $V_S$ is of low, constant value as determined by Equation (1), the magnetoresistance element 5 is protected from a deleterious breakdown voltage or from a voltage that destroys its operating characteristics due to its bias dependability. On the other hand, the output voltage produced by the capacitor 8 is of sufficient magnitude for the corresponding comparator 10 to clearly distinguish between two binary levels. Even if the magnetoresistance element 5 has a high parasitic wiring resistance or a low magnetoresistance ratio, or the switching transistor 4 has a large turn-on resistance, a high output voltage can be developed by the capacitor 8 by optimizing the capacitance C, the voltage $V_S$, the electrical resistance of the magnetoresistance element 5, and the length of time "t" required for the capacitor 8 to discharge its stored energy.

In addition, the read-out speed of the magnetic RAM of this invention is primarily determined by the capacitance C, the voltage $V_S$, the electrical resistance of the magnetoresistance element 5. Therefore, a high speed read operation can be achieved by optimizing these parameters. Note that since capacitors 8 are charged during an idle period, the read operation of the magnetic RAM is not adversely affected when the capacitors 8 are charged.

As described above, the transistors 4 of the same word line are simultaneously turned ON, causing currents to flow through the magnetoresistance elements of the same word line. Therefore, more than one memory cell can be read out in parallel from the same word line by simultaneously turning off the transistors 7 of more than one sense circuit 6. Since the read operation of this invention is based on the utilization of the energy stored on capacitors, the power needed for this simultaneous readout is significantly small, and hence a high readout efficiency can be achieved in terms of the ratio of the amount of data read out of the memory to the amount of power needed to read the data.

While mention has been made of a sequence in which the transistor 4 of memory cell is first turned on, followed by the turn-off of the corresponding transistor 7, the present invention could equally be as well operated when the sequence of operation is reversed, or when they are simultaneously operated. In addition, if the sense lines 2 have parasitic capacitances capable of storing sufficient energy for read operation, the parasitic capacitances can be used instead of the discrete capacitors 8.

In the first embodiment, the voltage developed by each capacitor 8 is compared with a constant threshold voltage to deliver an output signal. In a second embodiment shown in FIG. 2, a clear distinction between the two discrete levels is provided to ensure against possible variability caused by manufacturing tolerances. This is accomplished by producing complementarily different resistance states of magnetoresistance elements and making a comparison between resultant voltages developed on capacitors.

Figure 2:
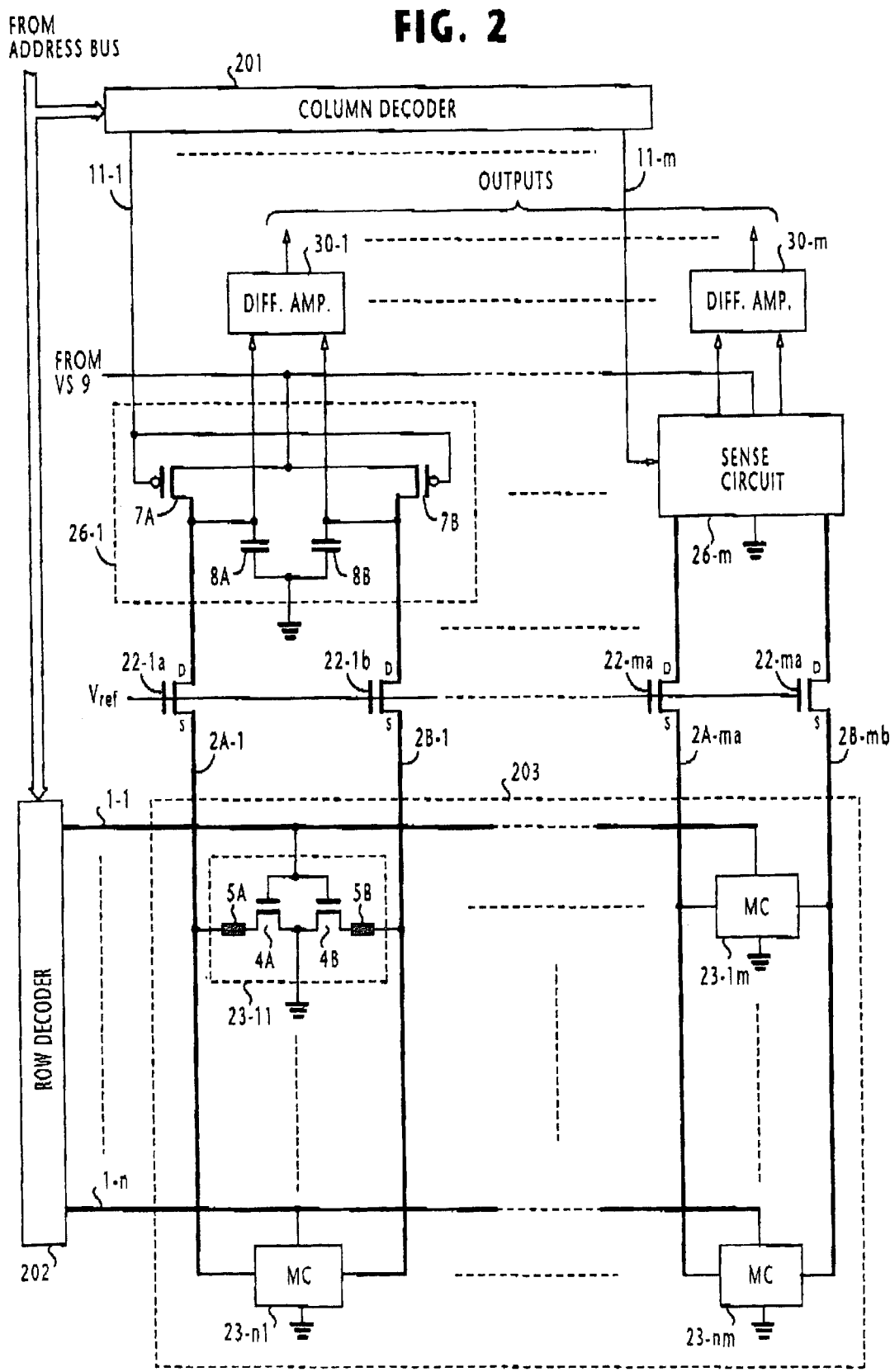
FIG. 2 is a block diagram of a magnetic random access memory according to a second embodiment of the present invention.

In the cell array 203 of FIG. 2, each memory cell 23 is connected to a corresponding pair of sense lines 2A, 2B and a corresponding word line 1 from the row decoder 202 and is composed of transistors 4A, 4B and magnetoresistance elements 5A, 5B. Paired sense lines 2A-1, 2B-1~2A-m, 2B-m are connected to sense circuits 2614 1~26-m, respectively. Each sense circuit 26 is composed of transistors 7A, 7B and capacitors 8A, 8B and is connected to respond to a signal from a corresponding column line 11 from the column decoder 201. Differential amplifiers 30–1~30-m, respectively associated with the sense circuits 26–1~26-m, are provided.

Similar to the first embodiment, a pair of MOS transistors 22-a and 22-b are connected in each pair of sense lines 2A and 2B with their drain-source paths connected between the associated sense circuit 26 and the associated columns of memory cells 23. The gates of transistors 22-1a, 22-1b~22-ma, 22-mb of all sense lines are supplied with the same reference voltage $V_{ref}$.

In a representative memory cell 23–11, the transistor 4A has its drain connected through the magnetoresistance element 5A to the sense line 2A-1 and its gate connected to the word line 1—1 and the transistor 4B has its drain connected through the magnetoresistance element 5B to the sense line 2B-1 and its gate connected to the word line 1—1. The sources of transistors 4A and 4B are connected together to ground. Magnetoresistance elements 5A and 5B of each memory cell have opposite directions of magnetization so that when one of the magnetoresistance elements is in a high resistance state the other element is in a low resistance state.

In each sense circuit 26, the transistor 7A has its inverted gate connected to the column line 11–1 and its source-drain path connected between the voltage source 9 and the sense line 2A-1. Capacitor 8A is connected between the sense line 2A-1 and ground. In a similar manner, the transistor 7B has its inverted gate connected to the column line 11-1 and its source-drain path connected between the voltage source 9 and the sense line 2B-1. Capacitor 8B is connected between the sense line 2B-1 and ground.

In response to a read command signal from a row decoder 202, the transistors 4A and 4B of all memory cells of an addressed word line are turned on to cause currents to flow through all sense lines 2A-1, 2B-1~2A-ma, 2B-mb and through their magnetoresistance resistance elements 5A, 5B to ground. In response to a read command signal from the column decoder 201, the transistors 7A and 7B of an addressed sense circuit 26 are turned off, causing its capacitors 8A and 8B to discharge stored energy through the addressed sense lines to ground at rates determined by the electrical resistance values of the magnetoresistance elements of the addressed memory to cell, producing a pair of decreasing voltages on the addressed sense lines.

Differential amplifier 30–1 is connected to the capacitors 8A and 8B to produce an output voltage representative of the difference between the voltage developed by capacitor 5A according to the magnetization of magnetoresistance element 5A at a time "t" after the transistor 7A is turned OFF and the voltage developed by capacitor 8B according to the magnetization of magnetoresistance element 5B at time "t" after the transistor 7B is turned OFF.

As given by Equation (2), the voltages developed on capacitors 8A and 8B vary depending on the electrical resistance of the magnetoresistance elements 4A and 4B, If a "1" is to be stored on the memory cell 23–11, the magnetoresistance elements 4A and 4B are set in high and low resistance states, respectively. In this case, the decreasing voltage on capacitor 8B is higher than the decreasing voltage on capacitor 8A. Conversely, if a "0" is stored on the memory cell 23–11, the magnetoresistance elements 4A and 4B are set in low and high resistance states, respectively. In this case, the decreasing voltage on capacitor 8A is higher than the decreasing voltage on capacitor 8B.

Since currents continue to flow through the magnetoresistance elements 5A and 5B of the addressed memory cell 23–1 following the turn-off of transistors 7A and 7B, the voltages at the input terminals of transistors 22-1a and 22-1b are reduced by an amount corresponding to a voltage drop in the transistors 7A and 7B. Since the voltage $V_S$ at the output terminal of each of transistors 22-1a and 22-1b is maintained at a low constant level as given by Equation (1), the voltage $V_D(t)$ developed on each of the capacitors 8A and 8B at time "t" after the turn-off of transistors 7A and 7B is given by Equation (2). Magneto-resistance elements 5A and 5B are protected from a deleterious breakdown voltage or a voltage that would destroy their operating characteristics due to bias dependability.

In quantitative terms, the output voltage $V_{OUT}(t)$ of the differential amplifier 30 at time "t" after the turn-off of transistors 7A and 7B is given by the following Equation:

$$V_{OUT}(t) = \frac{V_S}{C}\left(\frac{1}{R_L} - \frac{1}{R_H}\right)t \quad (3)$$

where, $R_L$ is the value of the load resistance of the transistor 4A or 4B when the magnetoresistance element 5A or 5B is in a low resistance state and $R_H$ is the value of that load resistance when the magnetoresistance element 5B or 5A is in a high resistance state. Note that the load resistance of a transistor of a memory cell is a resultant value of the resistances of the sense line, the magnetoresistance element and the transistor. If C=1 pF, $V_S$=250 mV, $R_L$=10 kΩ and $R_H$=12 kΩ and if the discharge time of each of capacitors 8A, 8B is 24 nanoseconds, an output voltage $V_{OUT}$(t=24 ns) of ±100 mV will be produced in response to a "1" or "0" stored in the memory cell. In a practical aspect, the output voltage of this level is comparable to the input voltage of sense amplifiers used in conventional dynamic RAMs.

Figure 3:
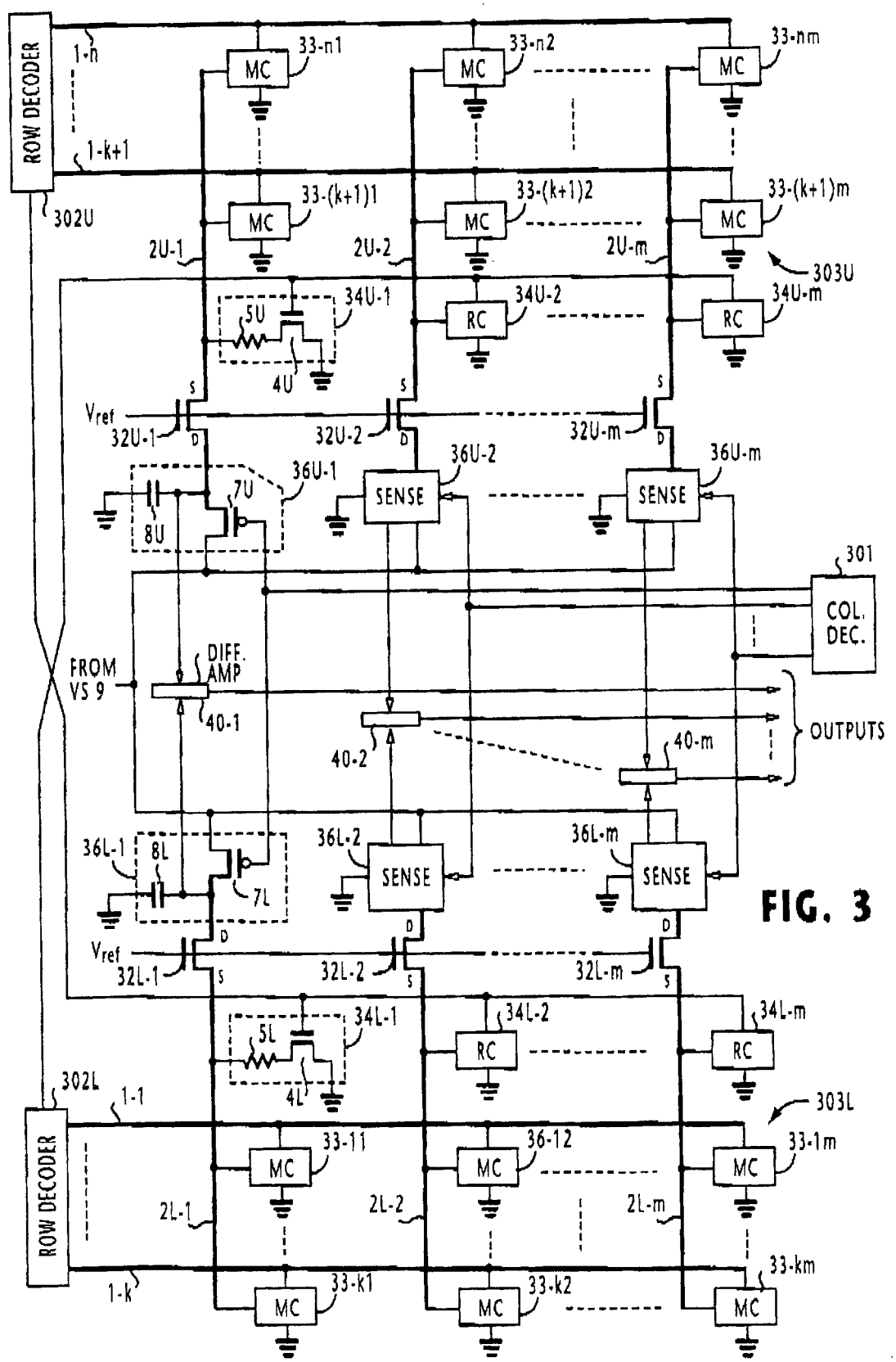
FIG. 3 is a block diagram of a magnetic random access memory according to a third embodiment of the present invention.

FIG. 3 is a block diagram of a third embodiment of the present invention. In this embodiment, the memory cells are divided into a first cell array 303L of memory cells 33-11~33-km and a second cell array 303U of memory cells 33-(k+1)1~33-nm. Memory cells of the first cell array 303A are connected to the intersections of word lines 1-1~1-k of a row decoder 302L and sense lines 2L-1~2L-m, which are in turn connected to a plurality of sense circuits 36L-1~36L-m. Memory cells of the second cell array 303U are connected to the intersections of the word lines 1-k+1~1-n of a row decoder 302U and the sense lines 2U-1~2U-m, which are in turn connected to a plurality of sense circuits 36U-1~36U-m corresponding to the sense circuits 36L-1~36L-m, respectively. The differences between the output voltages of sense circuits 36L and the corresponding sense circuits 36U are detected by differential amplifiers 40-1~40-m, respectively. All sense circuits 36 are of identical configuration to the sense circuits of FIG. 1. Column decoder 301 supplies a column select signal to the transistors 7 of a corresponding pair of sense circuits 36L and 36U to discharge their capacitors 8 at the same time.

A plurality of reference cells 34L-1~34L-m are connected to the sense lines 2L-1~2L-m and a plurality of reference cells 34U-1~34U-m are connected to the sense lines 2U-1~2U-m. All reference cells 34L are each composed of a MOS transistor 4U and a reference resistor 5U and all reference cells 34L are each composed of a MOS transistor 4L and a reference resistor 5L. In each reference cell 34, the source-drain path of its transistor is connected between the corresponding sense line and ground through the reference resistor. The gates of transistors 4U are connected together to the row decoder 302L and the gates of transistors 4L are connected together to the row decoder 302U. Row decoder 302L turns ON the reference transistors of all reference cells 34U when reading one of the memory cells of the cell array 303L and the row decoder 302U turns ON the reference transistors of all reference cells 34L when reading the memory cells of the cell array 303U.

A plurality of lower-group transistors 32L-1~32L-m are connected respectively in the sense lines 2L-1~2L-m between the cell array 303L and the sense circuits 36L-1~36L-m to maintain the sense lines at low, constant voltage regardless of voltages developed by the capacitors 8L. Likewise, a plurality of upper-group transistors 32U-1~32U-m are connected respectively in the sense lines 2U-1~2U-m between the cell array 303U and the sense circuits 36U-1~36U-m to maintain the sense lines at low, constant voltage regardless of voltages developed by the capacitors 8U. The magnetoresistance elements of all memory cells are therefore protected from deleterious breakdown voltage, or a voltage that would destroy their operating characteristics, while the capacitors 8U and 8L produce voltages of sufficient magnitude for the differential amplifiers 40-1~40-m for making a clear distinction between them, eliminating the need for high precision differential amplifiers.

When the memory cell 33-11 of cell array 303L is addressed during a read operation, for example, the transistors 7L and 7U of the sense circuits 36L-1 and 36U-1 turn OFF simultaneously, and the energy stored on capacitor 8U is discharged through the transistor 4U and resistor 5U of the reference cell 34U-1 to ground. Concurrently, the energy stored on capacitor 8L is discharged to ground through the transistor 4 and magnetoresistance element 5 of the cell 33-11. The difference between the voltages developed on the capacitors 8U and SL is detected by the differential amplifier 40–1 as a stored content of the addressed memory cell 33–11.

When the memory cell 33-n1 of the array 303U is addressed, the energy stored on capacitor 8U is discharged to ground through the transistor 4 and magnetoresistance element 5 of the cell 33-n1. Concurrently, the energy stored on capacitor 8L is discharged through the transistor 4L and resistor 5L of the reference cell 34L-1 to ground. In this way, the difference between the voltages developed on the capacitors 8U and 8L is detected by the differential amplifier 40-1 as a stored content of the addressed memory cell 33-n1.

The symmetrical arrangement of the cell arrays 303L and 303U with respect to the reference cells 34U and 34L serves to reduce performance variability which would otherwise be caused by manufacturing tolerances, Since the readout speed of the memory of FIG. 3 is primarily determined by the capacitance value of capacitors 8U, 8L, the electrical resistance of, and the low voltage $V_S$ applied to, each magnetoresistance element, high speed readout operation can be achieved by optimizing these device parameters. As in the previous embodiments, the capacitors 8U, 8L are charged during an idle period, and hence their charging operations do not adversely affect the readout operation.

Figure 4:
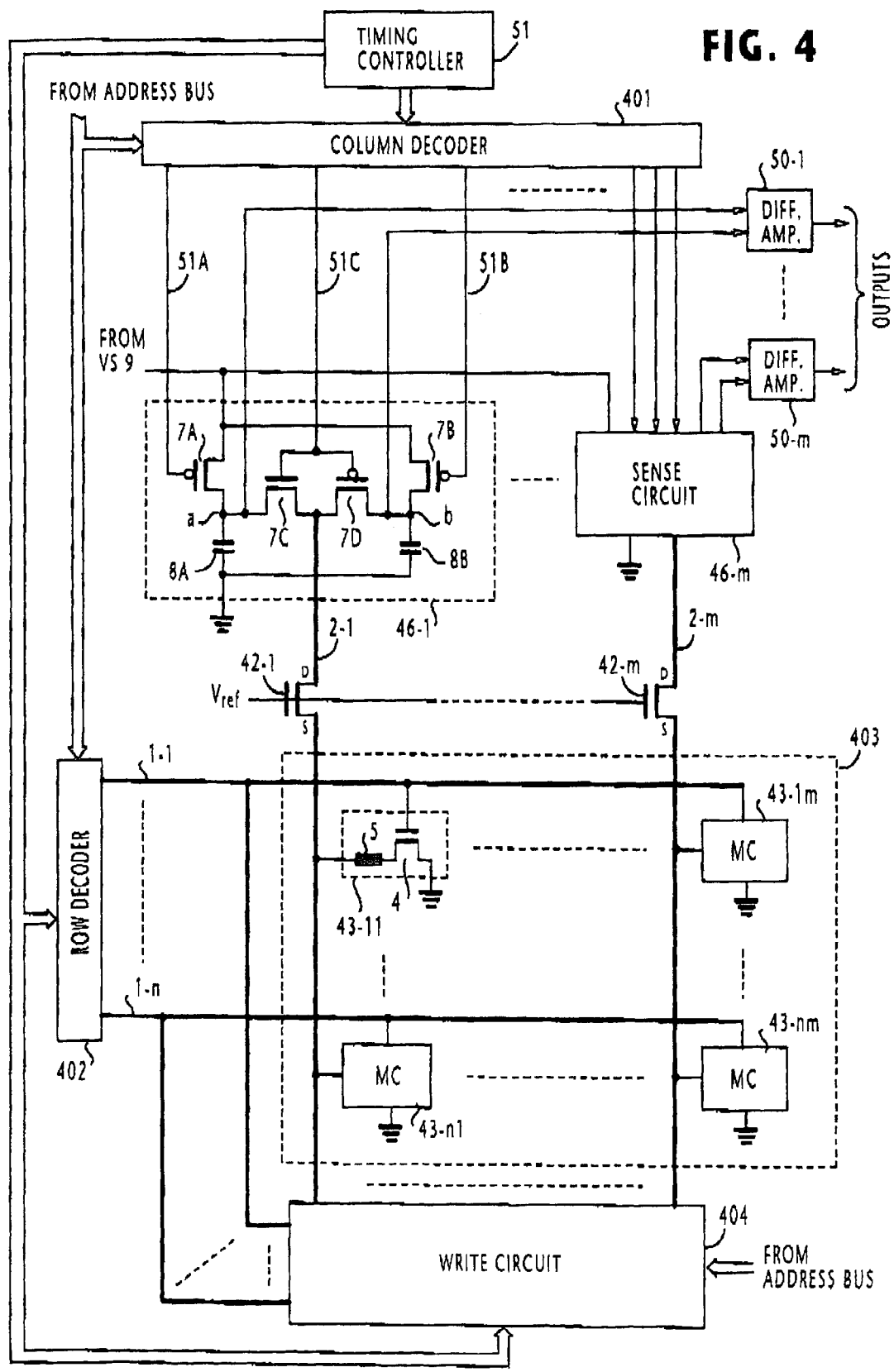
FIG. 4 is a block diagram of a magnetic random access memory according to a fourth embodiment of the present invention.

In a fourth embodiment of the present invention shown in FIG. 4, each memory cell has dual functions of first reading a stored data value and then reading a stored reference value after having a write circuit store the reference value.

The memory of FIG. 4 is comprised of a column decoder 401 including "m" sets of column output lines 51A, 51B, 51C that correspond to the sense lines 2–1~2-m. Each set of column output lines 51 is connected to a corresponding one of a plurality of column drive and sense circuits 46-1~46-m. Row decoder 402 drives the word lines 1—1~1-n and the sense circuits 46 drive the sense lines 2–1~2-m. Memory cells 43, which form a cell array 403, are connected to the intersections of these word and sense lines in a manner similar to the first embodiment. A write circuit 404 is connected to the word lines 1 and the sense lines 2 for writing data into the magnetoresistance elements 5 of the memory cells 43 according to row and column addresses supplied from the address bus during a write mode of the MRAM.

A timing controller 51 is provided for controlling the operation of the column decoder 401, the row decoder 402 and the write circuit 404.

Each of the sense circuits 46 is comprised of MOS transistors 7A, 7B and capacitors 8A, 8B for developing data and reference voltages, respectively. The source-drain paths of transistors 7A and 7B and the capacitors 8A and 8B are connected in series between the voltage source 9 and ground, and the inverted gates of transistors 7A and 7B are respectively connected to the column output lines 51A and 51B. A circuit node "a" between the transistor 7A and the capacitor 5A of each sense circuit 46 is connected to the first input of a differential amplifier 50 which corresponds to the sense circuit and a circuit node "b" between the transistor 7B and the capacitor 8B of the sense circuit 46 is connected to the second input of the differential amplifier 50.

MOS transistors 7C and 7D are provided in each of the sense circuits 46. In each sense circuit, the transistor 7C has its source-drain path connected between the circuit node "a" and the corresponding sense line 2 for producing a data voltage on capacitor 8A and the transistor 7D has its source-drain path connected between the circuit node "b" and the corresponding sense line for producing a reference voltage on capacitor 8B. The gate of transistor 7C and the inverted gate of transistor 7D are connected together to the column output line 51C to mutually exclusively establish a discharging path for the capacitors 8A and 8B to the corresponding sense line.

A plurality of transistors 42–1~42-m are connected respectively in the sense lines 2–1~2-m between the cell array 403 and the sense circuits 46-1~46-m to maintain the sense lines at low, constant voltage regardless of voltages developed by the capacitors 8A, 8B. The magnetoresistance elements of all memory cells are protected from a deleterious breakdown voltage, or a voltage that would destroy their operating characteristics.

When the magnetic RAM is in an idle state, the output lines 51A are 51B of all sets of output lines are driven to a low level and the output lines 51C of all sets are driven to a high level. As a result, the transistors 7A, 7B and 7C of all sense circuits 46 switch to an ON state and their transistors 7D are in an OFF state, setting all sense lines 2 at the initial voltage $V_{D0}$. Therefore, the capacitors 8A and 8B of all sense circuits are charged to the initial voltage $V_{D0}$.

During a write mode, the write circuit 404 activates one of its arrayed coils that corresponds to a memory cell 43 to be addressed and magnetizes the magnetoresistance element 5 of the memory cell in a direction according to the binary level of the information to be stored in that memory cell.

During a read mode, the timing controller 51 first causes the row decoder 402 to address one of the word lines 1 with a reference voltage $V_{ref}$. This turns ON all transistors 4 of the memory cells 43 attached to the addressed word line. Since the transistors 7A, 7C of each sense circuit 46 are in the ON state, a current flows from the voltage source 9 into the magnetoresistance element 5 of all memory cells of the addressed word line. Then, the timing controller 51 causes the column decoder 401 to switch one of its the output lines 51A from low to high level. This turns OFF the transistor 7A, causing the associated capacitor 8A to begin to discharge its stored energy through the associated transistor 7C to the magnetoresistance element 5 of the addressed memory cell. As a result, the voltage across the capacitor 8A drops with time as defined in Equation (2).

At a predetermined time after the turn-off of the transistor 7A, the timing controller 51 directs the row decoder 402 to removes the reference voltage $V_{ref}$ from the addressed word line, so that the transistors 4 of all memory cells of the word line are turned OFF, thus stopping the discharging current that is flowing from the capacitor 8A to the magnetoresistance element 5 of the address memory cell. Timing controller 51 then operates the write circuit 404 to magnetize the magnetoresistance element 5 of the addressed memory cell in such a direction that the magnetoresistance element is switched to a predetermined reference state.

Timing controller 51 then directs the column decoder 401 to cause the column output line 51C to switch from high to low level, so that the transistor 7C is tuned OFF and the transistor 7D is turned ON, and directs the row decoder 402 to apply the reference voltage again to the addressed word line to turn the transistors 4 of the word line to an ON state. Since the transistors 7B, 7D of the addressed sense circuit and the transistor 4 of the addressed memory cell are in the ON state, a current flows into the magnetoresistance element 5 of the addressed memory cell.

Timing controller 51 then directs the column decoder 401 to cause the column output line 51B to switch from low to high level, thus switching the transistor 7B to an OFF state. As a result, the capacitor 8B begins to discharge its energy and the voltage across this capacitor drops at a rate determined by the stored reference state of the magnetoresistance element 5.

At a predetermined time after the turn-off of the transistor 7B, the timing controller 51 directs the row decoder 402 to remove the reference voltage from the addressed word line in order to turn OFF the transistors 4 of the memory cells of the address word line, thus stopping the discharging current supplied from the capacitor 8B to the magnetoresistance element 5 of the address memory cell.

Thus, a voltage is stored on the capacitor 8A as a representative of the binary state of the information stored in the addressed memory cell and a voltage is stored on the capacitor 8B as a representative of the reference state of the addressed memory cell. The difference between these voltages is detected by the corresponding differential amplifier 50.

Because of the self-referencing circuitry, the fourth embodiment of the present invention provides efficient utilization of chip space and robustness against performance variability.

Figure 5:
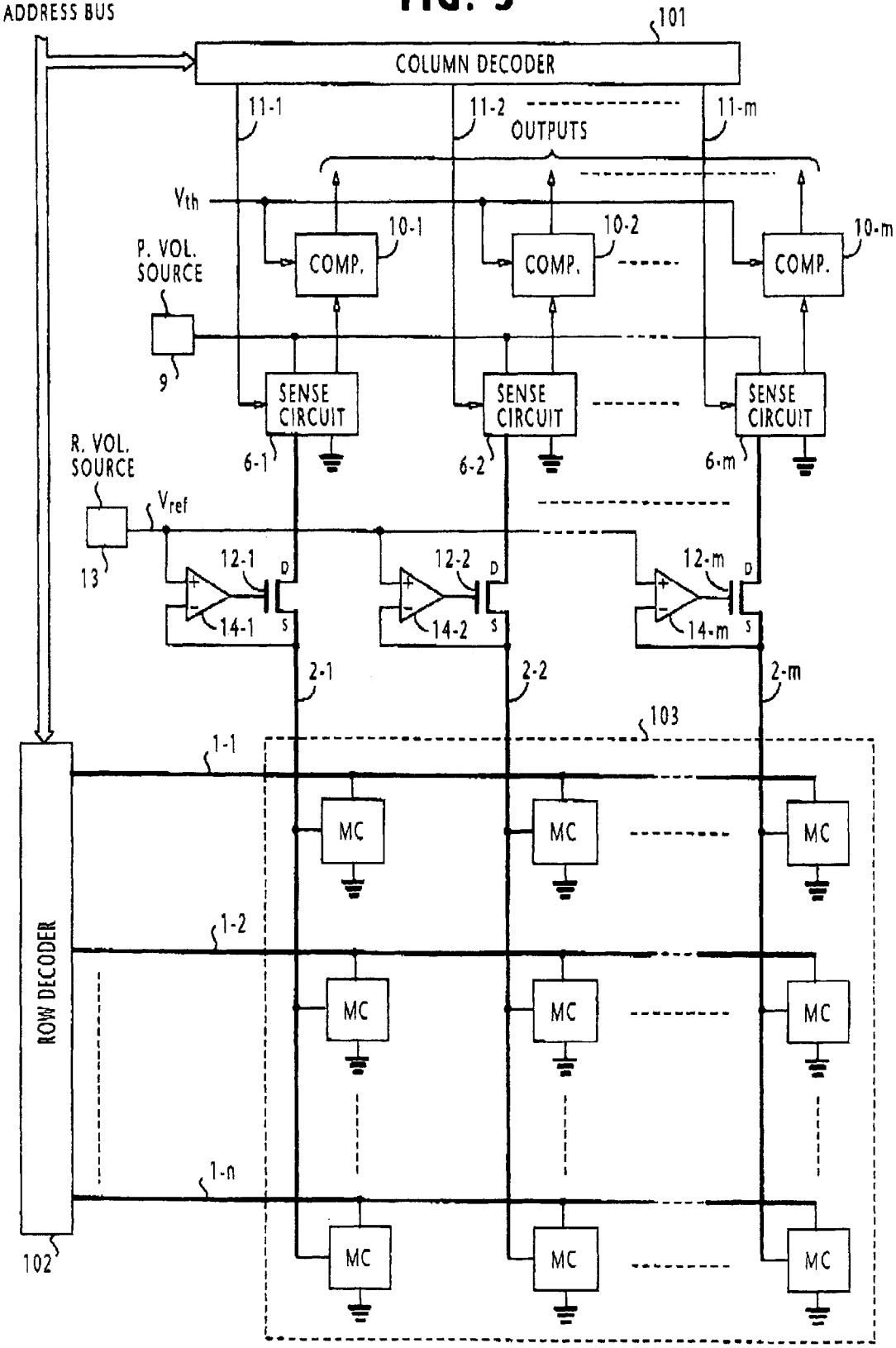
FIG. 5 is a block diagram of a magnetic random access memory according to a fifth embodiment of the present invention.

Variability of sense lines 2 may still exist due to voltage drifts caused by the mutual conductance of transistors 12. In order to compensate for such drifts of the sense-line voltages, the embodiment of FIG. 1 is modified and represented in FIG. 5 as a fifth embodiment of the present invention, In this modification, a plurality of differential amplifiers 14–1~14-m are provided as negative feedback control elements in a one-to-one correspondence to the transistors 12–1~12-m. Each of the differential amplifiers 14 has a positive input terminal connected to the reference voltage source 13 and a negative input terminal connected to the source electrode of the corresponding transistor 12 for comparing the line voltage $V_S$ of each sense line 2 with the reference voltage $V_{ref}$ to produce a difference voltage representing an offset value of the sense-line voltage from the reference voltage. The output of each differential amplifier 14 is applied to the gate of the corresponding transistor 12 so that when the sense-line voltage is lower than the reference voltage the gate voltage is driven upwards to increase the sense-line voltage. Otherwise, the gate voltage is driven downwards to decrease the sense-line voltage. As a result, offset voltages of all sense lines are reduced to a minimum and all sense circuits 6 operate with a uniform discharging characteristic to maintain the sense-line voltages precisely at a constant, same value.

It is apparent that the feedback voltage control circuitry of this embodiment could also be used in the sense lines of the other embodiments of the present invention.

What is claimed is:

1. A magnetic random access memory comprising:
   a plurality of word lines;
   a plurality of sense lines;
   a matrix array of memory cells, each memory cell being located on an intersection of a corresponding one of said word lines and a corresponding one of said sense lines, each memory cell including a magnetoresistance element and a switching element which establishes a connection between the corresponding sense line and the magnetoresistance element when the corresponding word line is addressed;
   a plurality of sense circuits respectively corresponding to said sense lines, each sense circuit including a capacitive element connected to the corresponding sense line and a switching element for applying a voltage to the capacitive element and discharging energy stored in said capacitive element when the corresponding sense line is addressed; and
   a plurality of voltage control elements respectively connected in said sense lines for maintaining the sense lines at constant lower voltages regardless of higher voltages respectively produced by said sense circuits.

2. The magnetic random access memory of claim 1, wherein each of said voltage control elements comprises a transistor having a gate connected to a source of reference voltage and a drain-source path connected in the corresponding sense line to maintain the corresponding sense line at said constant lower voltage.

3. The magnetic random access memory of claim 1, wherein each of said voltage control elements comprises a transistor having a gate connected to a source of reference voltage and a drain-source path connected in the corresponding sense line to maintain the corresponding sense line at said constant lower voltage, further comprising a plurality of differential amplifiers corresponding respectively to said sense lines, each of the differential amplifiers producing an output voltage representing an offset value of the constant lower voltage of the corresponding sense line from said reference voltage and controlling the gate electrode of a corresponding one of said transistors with said offset voltage in a direction towards minimizing said offset voltage.

4. The magnetic random access memory of claim 1, further comprising a plurality of comparators respectively corresponding to said sense circuits, each of the comparators comparing a voltage developed by the capacitive element of the corresponding sense circuit with a threshold voltage for producing an output voltage at one of two binary levels.

5. The magnetic random access memory of claim 1, wherein said magnetoresistance element of each of said memory cells is of tunnel junction type.

6. The magnetic random access memory of claim 1, wherein said magnetoresistance element of each of said memory cells comprises a giant magnetoresistance element.

7. The magnetic random access memory of claim 1, wherein said capacitive element of each of said sense circuits comprises a capacitor.

8. A magnetic random access memory comprising:
   a plurality of word lines;
   a plurality of pairs of sense lines;
   a matrix array of memory cells, each memory cell being located on an intersection of a corresponding one of said word lines and a corresponding one of the pairs of said sense lines, each memory cell including a first magnetoresistance element and a first switching element which establishes a first connection between a first one of the corresponding pair of sense lines and the first magnetoresistance element when the corresponding word line is addressed, each memory cell further including a second magnetoresistance element and a second switching element which establishes a second connection between a second one of the corresponding pair of sense lines and the second magnetoresistance element when the corresponding word lines is addressed;
   a plurality of sense circuits respectively corresponding to said pairs of sense lines, each sense circuit including a first capacitive element connected to a first one of the corresponding pair of sense lines and a first switching element for applying a voltage to the first capacitive element and discharging energy stored therein when said first one of the corresponding pair of sense lines is addressed, each sense circuit further including a second capacitive element connected to a second one of the corresponding pairs of sense lines and a second switching element for applying a voltage to the second capacitive element and discharging energy stored therein when the second one of the corresponding pair of sense lines is addressed simultaneously with said first one of the corresponding pair of sense lines; and
   a plurality of pairs of voltage control elements respectively connected in said pairs of sense lines for maintaining all the sense lines at constant lower voltages regardless of higher voltages respectively produced by said sense circuits.

9. The magnetic random access memory of claim 8, wherein each of said voltage control elements comprises a transistor having a gate connected to a source of reference voltage and a drain-source path connected in the corresponding sense line to maintain the corresponding sense line at said constant lower voltage.

10. The magnetic random access memory of claim 8, wherein each of said voltage control elements comprises a transistor having a gate connected to a reference voltage and a drain-source path connected in the corresponding sense line to maintain the corresponding sense line at said constant lower voltage, further comprising a plurality of differential amplifiers corresponding respectively to said sense lines, each of the differential amplifiers producing an output voltage representing an offset value of the constant lower voltage of the corresponding sense line from said reference voltage and controlling the gate electrode of a corresponding one of said transistors with said offset voltage in a direction towards minimizing said offset voltage.

11. The magnetic random access memory of claim 8, further comprising a plurality of differential amplifiers respectively corresponding to said sense circuits, each of the differential amplifiers producing a difference output representative of the difference between voltages developed by the first and second capacitive elements.

12. A magnetic random access memory comprising:
   a first plurality of word lines;
   a second plurality of word lines;
   a first plurality of sense lines;
   a second plurality of sense lines;
   a first plurality of reference cells respectively corresponding to said first plurality of sense lines, each reference cell including a resistance element and a switching element for establishing a resistive connection between the resistance element and the corresponding sense line when one of said second plurality of word lines is addressed;

a second plurality of reference cells respectively corresponding to said second plurality of sense lines, each reference cell including a resistance element and a switching element for establishing a resistive connection between the resistance element and the corresponding sense line when one of said first plurality of word lines is addressed;

a first matrix array of memory cells, each memory cell being located on an intersection of a corresponding one of said first plurality of word lines and a corresponding one of said first plurality of sense lines, each memory cell including a magnetoresistance element and a switching element for establishing a connection between the corresponding sense line and the magnetoresistance element when the corresponding word line is addressed;

a second matrix array of memory cells, each memory cell being located on an intersection of a corresponding one of said second plurality of word lines and a corresponding one of said second plurality of sense lines, each memory cell including a magnetoresistance element and a switching element for establishing a connection between the corresponding sense line and the magnetoresistance element when the corresponding word line is addressed;

a first plurality of sense circuits respectively corresponding to said first plurality of sense lines, each sense circuit including a capacitive element connected to the corresponding sense line and a switching element for applying a voltage to the capacitive element and discharging energy stored in said capacitive element when the corresponding sense line is addressed;

a second plurality of sense circuits respectively corresponding to said second plurality of sense lines, each sense circuit including a capacitive element connected to the corresponding sense line and a switching element for applying a voltage to the capacitive element and removing the voltage when the corresponding sense line is addressed for discharging energy from the capacitive element when the corresponding sense line is addressed;

a first plurality of voltage control elements respectively connected in said first plurality of sense lines for maintaining the first plurality of sense lines at constant lower voltages regardless of higher voltages respectively produced by said first plurality of sense circuits; and a second plurality of voltage control elements respectively connected in said second plurality of sense lines for maintaining the second plurality of sense lines at constant lower voltages regardless of higher voltages respectively produced by said second plurality of sense circuits.

13. The magnetic random access memory of claim 12, wherein each of said first plurality of voltage control elements comprises a transistor having a gate connected to a source of reference voltage and a drain-source path connected in the corresponding sense line to maintain the corresponding sense line at said constant lower voltage, and wherein each of said second plurality of voltage control elements comprises a transistor having a gate connected to said source of reference voltage and a drain-source path connected in the corresponding sense line to maintain the corresponding sense line at said constant lower voltage.

14. The magnetic random access memory of claim 12, wherein each of said first plurality of voltage control elements comprises a transistor having a gate connected to a source of reference voltage and a drain-source path connected in the corresponding sense line to maintain the corresponding sense line at said constant lower voltage, and wherein each of said second plurality of voltage control elements comprises a transistor having a gate connected to said source of reference voltage and a drain-source path connected in the corresponding sense line to maintain the corresponding sense line at said constant lower voltage, further comprising:

a plurality of differential amplifiers respectively corresponding to said first and second pluralities of sense lines, each of the differential amplifiers producing an output voltage representing an offset value of the constant lower voltage of the corresponding said sense line from said reference voltage and controlling the gate electrode of a corresponding one of said transistors with said offset voltage in a direction towards minimizing said offset voltage.

15. The magnetic random access memory of claim 12, further comprising a plurality of differential amplifiers, each differential amplifier producing an output voltage representative of the difference between a voltage developed across the capacitive element of a corresponding one of said first plurality of sense circuits and a voltage developed across the capacitive element of a corresponding one of said second plurality of sense circuits.

16. The magnetic random access memory of claim 12, wherein said first plurality of reference cells, said first matrix array of memory cells, and said first plurality of sense circuits are located symmetrically to said second plurality of reference cells, said second matrix array of memory cells, and said second plurality of sense circuits with respect to said plurality of differential amplifiers.

17. A magnetic random access memory comprising:

a plurality of word lines;

a plurality of sense lines;

a matrix array of memory cells, each memory cell being located on an intersection of a corresponding one of said word lines and a corresponding one of said sense lines, each memory cell including a magnetoresistance element and a switching element which establishes a connection between the corresponding sense line and the magnetoresistance element when the corresponding word line is addressed;

a plurality of sense circuits respectively corresponding to said sense lines, each sense circuit including;

a first capacitive element;

a first switching element for applying a voltage to the first capacitive element through a first circuit node;

a second capacitive element;

a second switching element for applying a voltage to the second capacitive element through a second circuit node; and a third switching element for exclusively connecting one of the first circuit node and the second circuit node to the corresponding sense line;

a timing controller;

a column decoder for selectively addressing said sense lines, the column decoder being responsive to control signals from the timing controller for controlling the first, second and third switching elements of one of the sense circuits corresponding to the addressed sense line for discharging energy stored in the first capacitive element of said one sense circuit and discharging energy stored in the second capacitive element of said one sense circuit;

a row decoder for selectively addressing said word lines;

a write circuit for initially setting one of the memory cells addressed by said column and row decoders in one of high and low resistance states depending on information to be stored therein, said write circuit being responsive to a control signal from said timing controller for setting said one memory cell in a reference resistance state after energy is discharged from said first capacitive element; and a plurality of voltage control elements respectively connected in said sense lines for maintaining the sense lines at constant lower voltages regardless of higher voltages respectively produced by said sense circuits.

18. The magnetic random access memory of claim 17, wherein each of said voltage control elements comprises a transistor having a gate connected to a source of reference voltage and a drain-source path connected in the corresponding sense line to maintain the corresponding sense line at said constant lower voltage.

19. The magnetic random access memory of claim 17, wherein each of said voltage control elements comprises a transistor having a gate connected to a source of reference voltage and a drain-source path connected in the corresponding sense line to maintain the corresponding sense line at said constant lower voltage, further comprising a plurality of differential amplifiers corresponding respectively to said sense lines, each of the differential amplifiers producing an output voltage representing an offset value of the constant lower voltage of the corresponding sense line from said reference voltage and controlling the gate electrode of a corresponding one of said transistors with said offset voltage in a direction towards minimizing said offset voltage.

20. The magnetic random access memory of claim 17, further comprising a plurality of differential amplifiers respectively corresponding to said sense circuits, each differential amplifier being connected to the first and second circuit nodes of the corresponding sense circuit for producing a voltage representative of the difference between voltages developed at said first and second circuit nodes.

* * * * *